United States Patent
Lee

(10) Patent No.: US 9,818,758 B2
(45) Date of Patent: Nov. 14, 2017

(54) THREE-DIMENSIONAL SEMICONDUCTOR DEVICE AND MANUFACTURING METHOD THEREOF

(71) Applicant: SK hynix Inc., Gyeonggi-do (KR)

(72) Inventor: Yeonghun Lee, Gyeonggi-do (KR)

(73) Assignee: SK Hynix Inc., Gyeonggi-do (KR)

(*) Notice: Subject to any disclaimer, the term of this patent is extended or adjusted under 35 U.S.C. 154(b) by 12 days.

(21) Appl. No.: 15/093,467

(22) Filed: Apr. 7, 2016

(65) Prior Publication Data

US 2017/0133397 A1    May 11, 2017

(30) Foreign Application Priority Data

Nov. 5, 2015    (KR) .................. 10-2015-0155278

(51) Int. Cl.
*H01L 23/535*    (2006.01)
*H01L 27/115*    (2017.01)
*H01L 27/11582*   (2017.01)
*H01L 21/768*    (2006.01)

(52) U.S. Cl.
CPC .. *H01L 27/11582* (2013.01); *H01L 21/76897* (2013.01); *H01L 23/535* (2013.01)

(58) Field of Classification Search
CPC .......................... H01L 27/11582; H01L 23/535
USPC ......................................................... 257/324
See application file for complete search history.

(56) References Cited

U.S. PATENT DOCUMENTS

2013/0100741 A1* 4/2013 Choi ................. H01L 27/11565
                                                      365/185.18
2015/0263023 A1* 9/2015 Toba ................. H01L 27/11548
                                                      257/314

FOREIGN PATENT DOCUMENTS

KR    1020110009014    1/2011
KR    1020130101811    9/2013

* cited by examiner

*Primary Examiner* — Moazzam Hossain
*Assistant Examiner* — Omar Mojaddedi
(74) *Attorney, Agent, or Firm* — IP & T Group LLP

(57) ABSTRACT

There are provided a 3-D semiconductor device and a manufacturing method thereof. The 3-D semiconductor device includes a substrate extending along a first plane defined by first and second x and y directions, the substrate having a pipe transistor formed therein, a plurality of word lines spaced apart at regular intervals along a third direction z perpendicular to the first and second x and y directions; a first vertical plug connected to a first end of the pipe transistor by passing vertically through the word lines; a second vertical plug, connected to a second end of the pipe transistor by passing vertically through the word lines; a bit line connected to a top surface of the first vertical plug; and a source line connected to a top surface of the second vertical plug, wherein the first and second vertical plugs have different size.

12 Claims, 19 Drawing Sheets

THREE-DIMENSIONAL SEMICONDUCTOR DEVICE AND MANUFACTURING METHOD THEREOF

CROSS-REFERENCE TO RELATED APPLICATION

The present application claims a priority to Korean patent application number 10-2015-0155278 filed on Nov. 5, 2015, the disclosure of which is incorporated herein by reference in its entirety.

BACKGROUND

1. Field

The present disclosure relates generally to a three-dimensional semiconductor device and, more particularly, to a three-dimensional semiconductor device including a plurality of U-shaped strings and a manufacturing method thereof.

2. Description of the Related Art

Semiconductor devices having a three-dimensional (3-D) structure (hereinafter referred to also as a 3-D semiconductor device) in which memory cells are 3-Dly arranged have been proposed for increasing integration of the semiconductor devices. Generally, 3-D semiconductor devices utilize the available area of a substrate more efficiently than semiconductor devices having a two-dimensional structure, hence, the integration of 3-D semiconductor devices is higher than the integration of 2-D semiconductor devices. Also, attempts to apply to the 3-D structure a regular arrangement of memory cells in a NAND flash memory device have being made.

Typically, a 3-D semiconductor device may include a string including a plurality of memory cells stacked in a multi-layer structure over a substrate and a select transistor. A string included in a 3-D nonvolatile memory device may have an 'I' or 'U' shape. A 3-D semiconductor device having an I-shaped string is referred to as terabit cell array transistor (TCAT) or bit-cost scalable (BICS). A 3-D semiconductor device having a U-shaped string is referred to as pipe-shaped, bit-cost scalable (P-BICS).

In a P-BICS, a string may include a pipe transistor and two vertical plugs. The pipe transistor is formed in parallel to a substrate. One vertical plug may be formed in a source region of the pipe transistor, whereas the other vertical plug may be formed in a drain region of the pipe transistor. A source line is formed over the vertical plug formed in the source region, and a bit line is formed over the vertical plug formed in the drain region.

SUMMARY

Various embodiments provide a 3-D semiconductor device and a manufacturing method thereof, with improved electrical characteristics of vertical strings formed in source and drain regions.

According to an aspect of the present disclosure, there is provided a 3-D semiconductor device, comprising: a substrate extending along a first plane defined by first and second x and y directions, the substrate having a pipe transistor formed therein, a plurality of word lines spaced apart at regular intervals along a third direction z perpendicular to the first and second x and y directions; a first vertical plug connected to a first end of the pipe transistor by passing vertically through the word lines; a second vertical plug, connected to a second end of the pipe transistor by passing vertically through the word lines; a bit line connected to a top surface of the first vertical plug; and a source line connected to a top surface of the second vertical plug, wherein the first and second vertical plugs have different size.

According to an aspect of the present disclosure, there is provided a method of manufacturing a 3-D semiconductor device, the method comprising: method of manufacturing a 3-D semiconductor device, the method comprising: alternately stacking a plurality of sacrificial layers and a plurality of interlayer insulating layers on a substrate in which a pipe region is defined; forming first and second vertical plugs passing vertically through the sacrificial layers and the interlayer insulating layers to be vertically connected to the pipe region, the first and second vertical plugs having different widths from each other; forming a slit passing vertically through the sacrificial layers and the interlayer insulating layers between the first and second vertical plugs; forming recesses between the interlayer insulating layers by removing the sacrificial layers exposed to an inside of the slit; and filling a conductive material in the recesses.

BRIEF DESCRIPTION OF THE DRAWINGS

It is noted, that in the drawings, dimensions may be exaggerated for clarity of illustration. Also, it will be understood that when an element is referred to as being "between" two elements, it may be the only element between the two elements, or one or more intervening elements may also be present. Like reference numerals refer to like elements throughout.

DETAILED DESCRIPTION

Hereinafter, exemplary embodiments of the present disclosure will be described in detail with reference to the accompanying drawings. It is noted, however, that the present disclosure is not limited to the described embodiments and may be implemented into different forms. The described embodiments are provided for illustrating the invention to those skilled in the relevant art.

Figure 1:
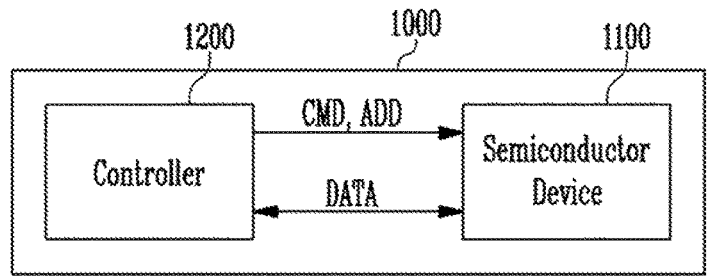
FIG. 1 is a diagram illustrating a semiconductor system including a semiconductor device and a controller, according to an embodiment of the present disclosure.

Referring to FIG. 1, a semiconductor system 1000, according to an embodiment of the present disclosure, may include a semiconductor device 1100 and a controller 1200 for controlling the semiconductor device 1100.

The semiconductor device 1100 may be a nonvolatile memory device. The semiconductor device 1100 may include, for example, a double data rate synchronous dynamic random access memory (DDR SDRAM), a low power double data rate 4 (LPDDR4) SDRAM, a graphics double data rate (GDDR) SRAM, a low power DDR (LPDDR), a rambus dynamic random access memory (RDRAM), and a flash memory. Hereinafter, the semiconductor device 1100 including a 3-D NAND flash memory is described as an example.

The controller 1200 may control overall operations of the semiconductor device 1100. The controller 1200 may transmit a command CMD and an address ADD for controlling the semiconductor device 1100 to the semiconductor device 1100 in response to a command received from a host (not shown). The controller 1200 may transmit and or receive data DATA to and or from the semiconductor device 1100.

The host may communicate with the semiconductor system 1000 by using an interface protocol, such as, for example, a peripheral component interconnect-express (PCI-E), an advanced technology attachment (ATA), serial ATA (SATA), a parallel ATA (PATA), or a serial attached SCSI (SAS) protocol.

Figure 2:
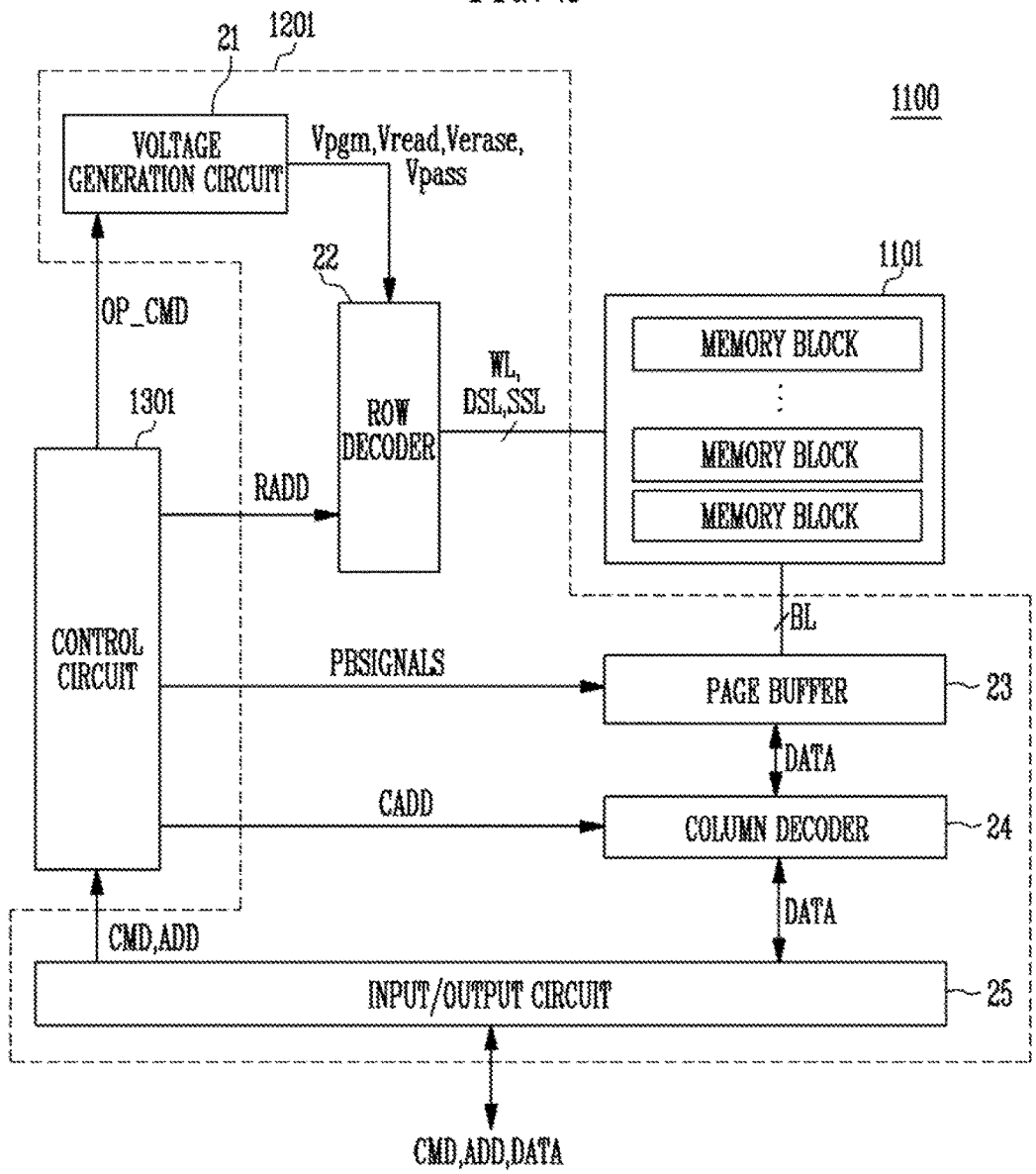
FIG. 2 is a diagram illustrating an example of a semiconductor device, according to an embodiment of the present disclosure.

Referring to FIG. 2, the semiconductor device 1100, according to an embodiment of the invention may include a memory cell array 1101 for storing data, a peripheral circuit 1201 for performing an operation, such as, for example, program, read, and or erase operations of the memory cell array 1101, and a control circuit 1301 for controlling the peripheral circuit 1201.

The memory cell array 1101 may include a plurality of memory blocks, each of which may include a plurality of memory cells. The memory blocks may be configured identically to one another. Each memory block may include a plurality of memory cells configured into a 3-D structure.

The peripheral circuit 1201 may include a voltage generation circuit 21, a row decoder 22, a page buffer 23, a column decoder 24, and an input/output circuit 25.

The voltage generation circuit 21 may generate one or more operation voltages. The voltage generation circuit 21 may generate a plurality of operation voltages having various levels. The one or more operation voltages may be generated by the voltage generation circuit 21 in response to an operation signal OP_CMD received from the control circuit 1301. The operation signal OP_CMD may include, for example, a program operation signal, a read operation signal, and or an erase operation signal. For example, if a program operation signal is applied to the voltage generation circuit 21, the voltage generation circuit 21 may generate operation a plurality of voltages related to the program operation, such as a program voltage Vpgm and a pass voltage Vpass. If a read operation signal is applied, the voltage generation circuit 21 may generate a plurality of operation voltages related to the read operation, such as, for example, a read voltage Vread and a pass voltage Vpass. If an erase operation signal is applied, the voltage generation circuit 21 may generate a plurality of operation voltages related to the erase operation, such as, for example, an erase voltage Verase and a pass voltage Vpass.

The row decoder 22 may select one of the memory blocks included in the memory cell array 1101 in response to a row address RADD to transmit operation voltages to local lines connected to the selected memory block. For example, the local lines may include word lines WL, drain select lines DSL, and source select lines SSL.

The page buffer 23 may be connected to the memory blocks through a plurality of bit lines BL. In a program, read, or erase operation, the page buffer 23 may transmit and or receive data to and or from the selected memory block in response to page buffer control signals PBSIGNALS, and arbitrarily store the data.

The column decoder 24 may transmit and or receive data DATA to and or from the page buffer 23 in response to a column address CADD.

The input/output circuit 25 may transmit, to the control circuit 1301, a command signal CMD and an address ADD received from an external device. The input/output circuit 25 may transmit data DATA received from an external device to the column decoder 24. The input/output circuit 25 may transmit the data DATA received from the column decoder 24 to an external device. The input/output circuit 25 may transmit the data DATA received from the column decoder 24 to the control circuit 1301.

The control circuit 1301 may output the operation signal OP_CMD, the row address RADD, the page buffer control signals PBSIGNALS, and the column address CADD for controlling the peripheral circuit 1201 in response to the command CMD and the address ADD.

Figure 3:
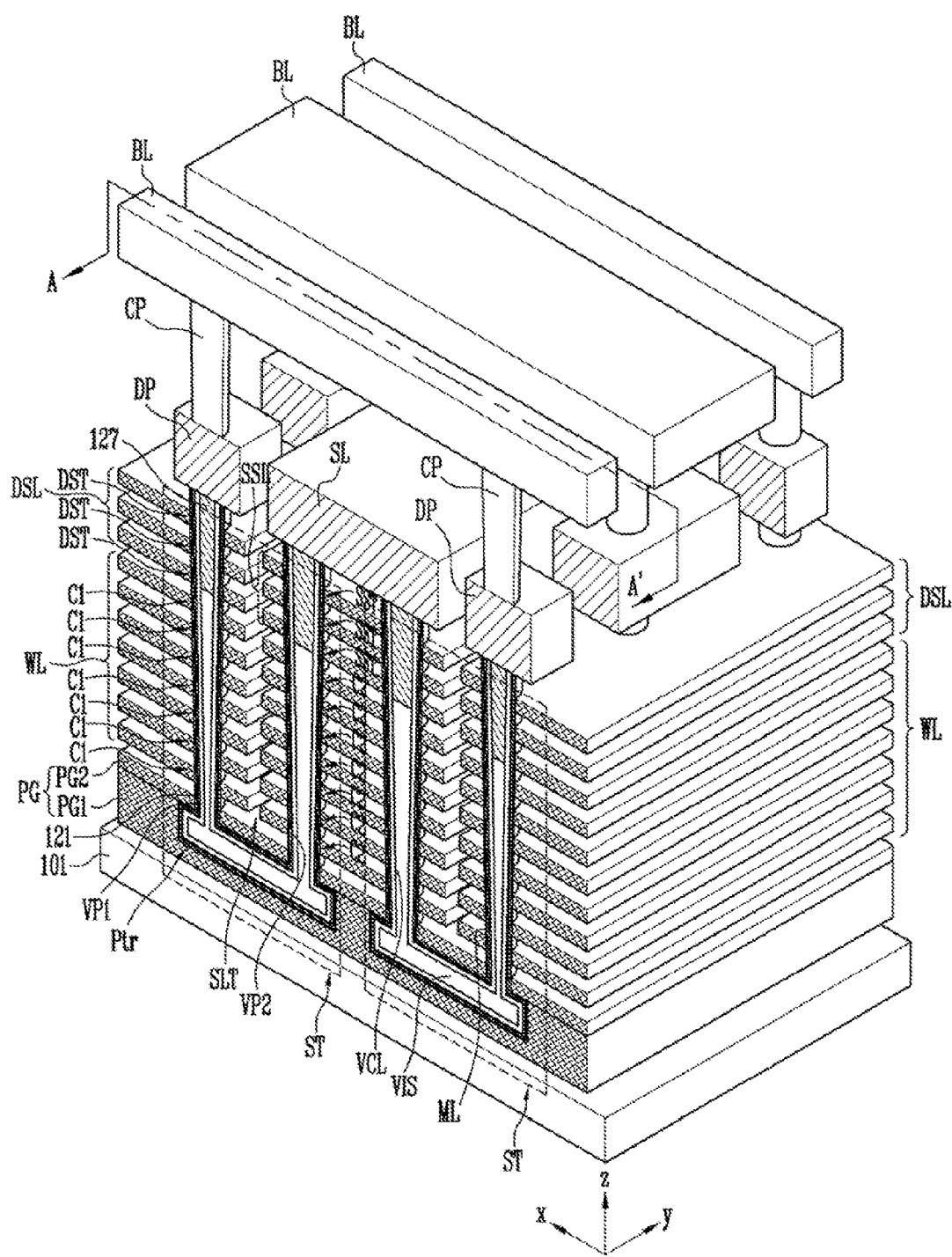
FIG. 3 is a perspective view illustrating a 3-D semiconductor device, according to an embodiment of the present disclosure.

Referring to FIG. 3, a memory block of the 3-D semiconductor device of FIG. 2, according to an embodiment of the present disclosure, may include a plurality of strings ST, each string ST being configured in a 'U' shape. Each string ST may include a first vertical plug VP1, a second vertical plug VP2, and a pipe transistor Ptr connecting lower portions of the first and second vertical plugs VP1 and VP2 to each other. The first and second vertical plugs VP1 and VP2 are elongated structures extending in a z direction perpendicular to a plane defined by the x and y directions. The first vertical plug VP1 may be formed in a drain region of the pipe transistor Ptr, and the second vertical plug VP2 may be formed in a source region of the pipe transistor Ptr. The first vertical plug VP1 may be connected to a bit line BL. The second vertical plug VP2 may be connected to a source line SL. For example, a drain contact pad DP may be formed on a top surface of the first vertical plug VP1, a contact plug CP may be formed on a top surface of the drain contact pad DP, and the bit line BL may be formed on a top surface of the contact plug CP. The drain contact pad DP and the contact plug CP may be formed of a conductive material so that the first vertical plug VP1 and the bit line BL may be electrically connected to each other. Each of the first and second vertical plugs VP1 and VP2 may include a memory layer. The bit line BL may be formed on a top surface of the contact plug CP. The source line SL may be formed on a top surface of the second vertical plug VP2.

The memory block having the 3-D structure described above will be described in detail as follows.

A plurality of bit lines BL may be formed on a top surface of respective first vertical plugs VP1. Each bit line BL may have an elongated structure extending along an x direction. The plurality of the bit lines BL may be spaced apart at regular intervals and in parallel to each other along a y direction. Each source line SL may be formed on the tops of the second vertical plugs VP2 of two adjacent strings ST and may extend along the y direction. A plurality of source lines SL may be arranged in parallel to each other at regular intervals along the x direction.

Each string ST may include a pipe transistor Ptr, a pair of memory cell groups C1 and C2 respectively connected to both ends of the pipe transistor Ptr, and drain select transistors DST and source select transistors SST, connected to the respective memory cell groups C1 and C2. The memory cell group C1 and the drain select transistors DST, may be included inside the first vertical plug VP1, whereas the memory cell group C2 and the source select transistors SST may be included inside the second vertical plug VP2.

The pipe transistor Ptr may be surrounded by a pipe gate PG. For example, the pipe gate PG may include a first pipe gate PG1 formed on a substrate 101 and a second pipe gate PG2 formed on a top surface of the first pipe gate PG1. The pipe transistor Ptr may be formed inside the first pipe gate PG1. The first and second vertical plugs VP1 and VP2 may be connected to the pipe transistor Ptr by passing through the second pipe gate PG2.

The pair of memory cell groups C1 and C2 may include first memory cells C1 formed in the first vertical plug VP1 and second memory cells C2 formed in the second vertical plug VP2. For example, the first and second vertical plugs VP1 and VP2 may include vertical channel layers VCL and memory layers ML. The memory layers may include tunnel insulating layers, charge trapping layers, and blocking layers. For example, the vertical channel layers may be vertically formed inside the first and second vertical plugs VP1 and VP2. The tunnel insulating layers may be formed to surround the vertical channel layers. The charge trapping layers may be formed to surround the tunnel insulating layers. The blocking layers may be formed to surround the charge trapping layers. For example, the blocking layers may be formed at the outermost sides of the first and second vertical plugs VP1 and VP2. When the vertical channel layers are formed in a tubular shape, vertical insulating layers VIS may be further formed inside the vertical channel layers. In order to improve electrical characteristics of the drain and source select transistors DST and SST, portions of the vertical Insulating layers VIS in regions in which the drain and source select transistors DST and SST are formed, may be removed therefrom, and a conductive layer 127 may be filled in the regions in which portions of the vertical Insulating layers VIS are removed.

The word lines WL may be stacked over the second pipe gate PG2 and may be spaced apart at regular intervals along a Z direction. In other words, the word lines may be spaced apart from each other at a preset distance. The drain select lines DSL and the source select lines SSL may be stacked over the word lines WL. The word lines WL, the drain select lines DSL, and the source select lines SSL may be separated by a slit SLT formed at the center of the U shape string ST. The slit SLT may be a vertical slit i.e. extending along a plane defined by the z and y directions perpendicular to the plane defined by the x and y directions. For example, the word lines WL may be separated, by the slit SLT, into a first set of word lines connected to the first vertical plug VP1 and a second set of word lines connected to the second vertical plug VP2. The drain select lines DSL and the source select lines SSL may also be separated from each other by the slit SLT. For example, the drain select lines DSL may be connected to the first vertical plug VP1, and the source select lines SSL may be connected to the second vertical plug VP2. For example, the drain select lines DSL and the source select lines SSL may be formed in the same layer, (e.g. at the same level), while being separated from each other by the slit SLT.

A pad DP, a contact plug CP, and a bit line BL may be stacked in the order named on the top surface of the first vertical plug VP1. The pad DP may be formed to prevent misalignment between the contact plug CP and the first vertical plug VP1. To this end, for example, the pad DP may be formed to have a width wider than the first vertical plug VP1 and the contact plug CP.

A source line SL may be formed on the top surface of the second vertical plug VP2. The source line SL may be formed on the top surfaces of two second vertical plugs of two adjacent strings ST. The source line SL may be formed in an elongated or line shape extending along the y direction. The plurality of source lines SL, and the drain contact plugs DP may be formed at the same level or height from the pipe transistor Ptr.

As described above, the first vertical plug VP1 and the second vertical plug VP2 may be configured into the 'U' shape through the pipe transistor Ptr, and hence the length between the bit line BL and the source line SL may increase. Therefore, a difference in electrical characteristics between the drain region and the source region may occur. In order to reduce the difference in electrical characteristics, the widths of the first and second vertical plugs VP1 and VP2 may be formed different from each other. The widths of the first and second vertical plugs VP1 and VP2 will be described in detail as follows.

Figure 4:
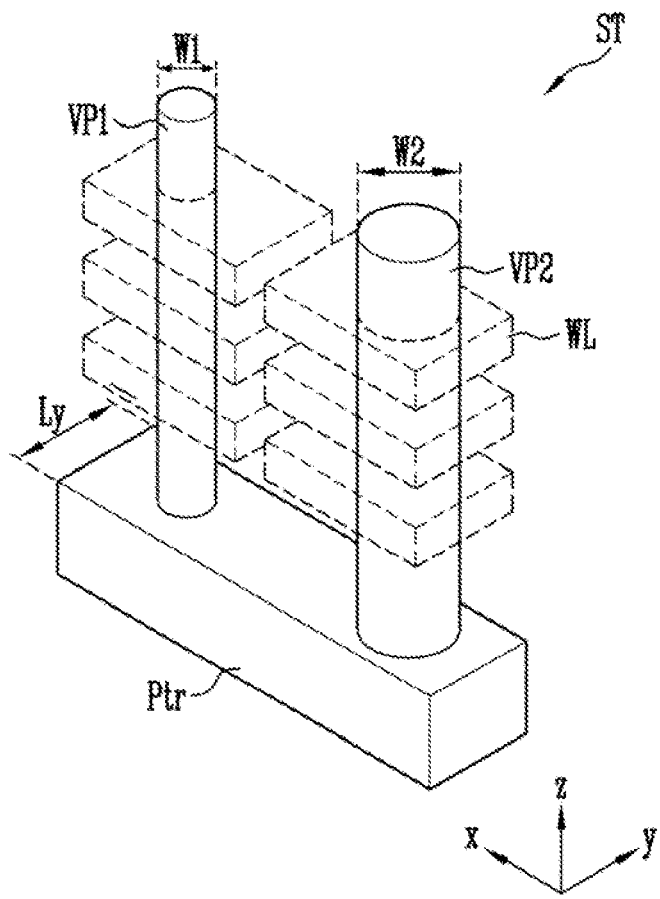
FIG. 4 is a partial view of a 3-D semiconductor device illustrating two vertical plugs, according to an embodiment of the present disclosure.

FIG. 4 is a partial, enlarged view of the 3-D semiconductor device of FIG. 3 illustrating two vertical plugs of the same string, according to an embodiment of the present disclosure.

Referring to FIG. 4, first and second vertical plugs VP1 and VP2 may be formed on a top surface of a pipe transistor Ptr. The first and second vertical plugs VP1 and VP2 may have different cross sections from each other. The first and second vertical plugs VP1 and VP2 may have different widths (or diameters) from each other. For example, the widths of the first and second vertical plugs VP1 and VP2 may be adjusted based on a difference in a program disturbance between the first and second vertical plugs VP1 and VP2 or a difference between speeds of a program or erase operation. More specifically, the first and second vertical plugs VP1 and PV2 may be formed so that, between the first and second vertical plugs VP1 and VP2, the width of one vertical plug having a weak program disturbance or a slow program or erase operation speed may be narrower than the width of the other vertical plug. If the width of the vertical plug is small, an area of a region in which memory cells and word lines WL are adjacent to each other may be reduced, and therefore, the program operation may be performed by using a low program voltage. For example, if it is assumed that the first vertical pug VP1 has a first width W1 and has a lower program disturbance than the second vertical plug VP2, the second vertical plug VP2 may be formed to have a second width W2 wider than the first width W1. The second width W2 may be set narrower than a length Ly of a minor axis (y direction) of the pipe transistor Ptr. For example, the second width W2 may be set wider than the first width W1 and narrower than the length Ly of the minor axis of the pipe transistor Ptr.

Cross sections (in the x-y direction) of the first and second vertical plugs VP1 and VP2 will be described in detail as follows.

Figure 5:
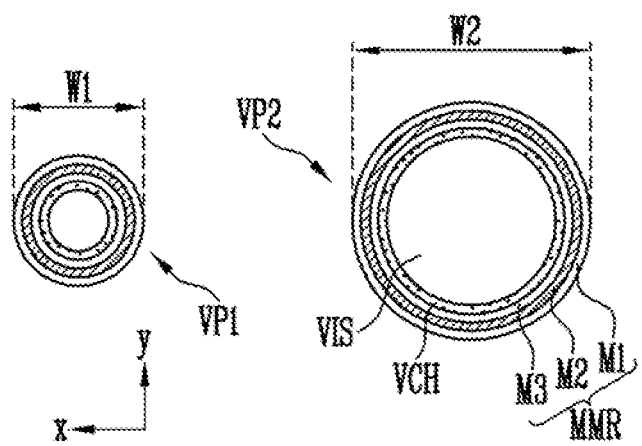
FIG. 5 is a cross sectional view of the vertical plugs of FIG. 4, according to an embodiment of the present disclosure.

FIG. 5 is a cross sectional view illustrating exemplary structures of the vertical plugs of FIG. 4 according to an embodiment of the present disclosure.

Referring to FIG. 5, the first and second vertical plugs VP1 and VP2 may include a memory layer MMR, a vertical channel layer VCH, and a vertical insulating layer VIS, respectively. For example, when the vertical insulating layer VIS may be formed at the center of each of the first and second vertical plugs VP1 and VP2. The vertical channel layer VCH may be formed to surround the vertical Insulating layer VIS. The memory layer MMR may be formed to surround the vertical channel layer VCH. The memory layer MMR may include a blocking layer M1, a charge trapping layer M2, and a tunnel insulating layer M3. The blocking layer M1 may be the outermost layer of the memory layer MMR. The tunnel insulating layer M3 may be the inner most layer of the memory layer MMR. The charge trapping layer M2 may be an intermediate layer formed between the blocking and the tunnel insulating layers M1 and M3. The various memory layers may be formed sequentially starting with the outermost blocking layer. The blocking layer M1 and the tunnel insulating layer M3 may be formed of an oxide material. The charge trapping layer M2 may be formed of a nitride material. The vertical channel layer VCH may be formed of a doped polysilicon. The vertical Insulating layer VIS may be formed of an oxide material. The first vertical plug VP1 may be formed with a first width W1, and hence a circumference of the charge trapping layer M2 formed in the first vertical plug VP1 may be smaller than a circumference of the charge trapping layer M2 formed in the second vertical plug VP2. Thus, when memory cells included in the first vertical plug VP1 and memory cells included in the second vertical plug VP2 are programmed to have the same target voltage, the memory cells included in the first vertical plug VP1 may be programmed to have a lower program voltage than the memory cells included in the second vertical plug VP2.

The program disturbances of the first and second vertical plugs VP1 and VP2 or the speeds of the program or erase operation performed on the first and second vertical plugs VP1 and VP2 may be determined when a test operation is performed. Therefore, the widths of the first and second vertical plugs VP1 and VP2 may be determined based on a result of the test operation. The configuration or layout of the first and second vertical plugs VP1 and VP2 and the pipe transistor Ptr may vary.

Figure 6:
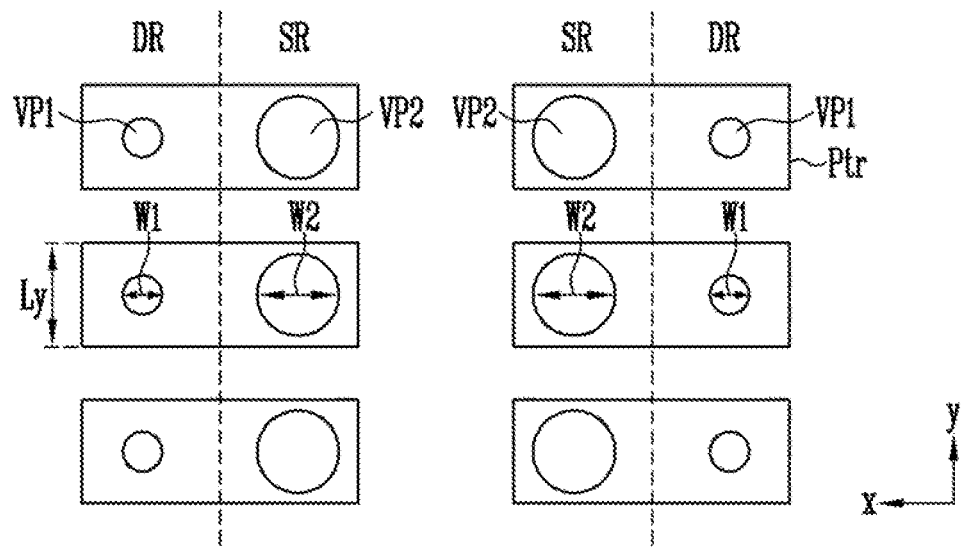
FIGS. 6 to 9 are layouts illustrating various arrangements of vertical plugs and pipe transistors, according to various embodiments of the present disclosure.

For example, referring to FIG. 6, a layout of pipe transistors Ptr and first and second vertical plugs VP1 and VP2 is provided, according to an embodiment of the present disclosure.

The pipe transistors Ptr may be arranged in a matrix form along a plane defined by the x and y directions. Each pipe transistor Ptr may have an elongated shape having a major axis along the x direction and a major axis along the y direction. For example, the major axis of each of the pipe transistors Ptr may extend in the x direction and in parallel to the plurality of the word lines. The first vertical plugs VP1 may be formed in drain regions DR of the pipe transistors Ptr. The second vertical plugs VP2 may be formed in source regions SR of the pipe transistors Ptr. Strings adjacent to each other in the y direction may be configured identically to each other. Strings adjacent to each other in the x direction may be configured symmetrically to each other. For example, the pipe transistors Ptr and the first and second vertical plugs VP1 and VP2 may be arranged so that the source regions SR of the pipe transistors Ptr may be adjacent to each other along the X direction. In the layout shown in FIG. 6, the first vertical plugs VP1 may be formed to have a first width W1, and the second vertical plugs VP2 may be formed to have a second with W2 wider than the first width W1. The second width W2 may be set narrower than a length Ly of the minor axis of the pipe transistor Ptr.

Figure 7:
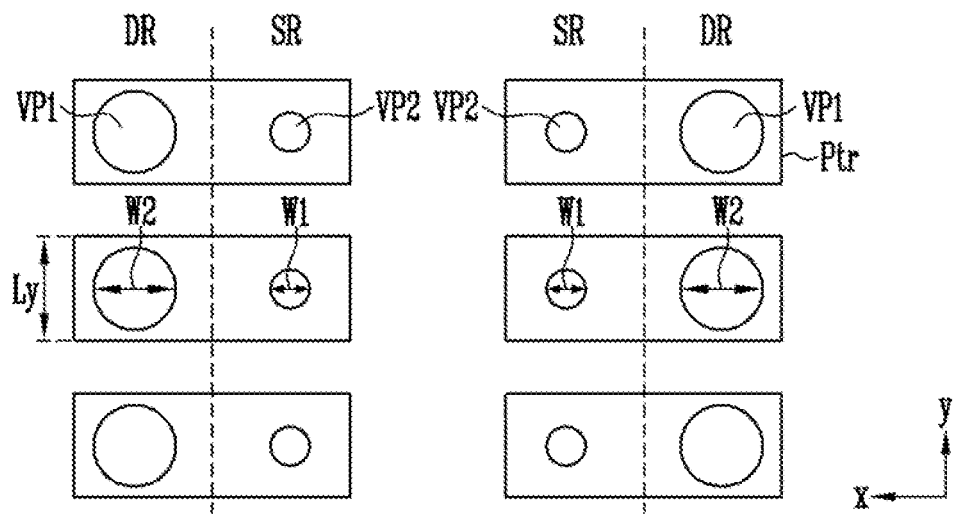

Referring to FIG. 7, a layout of pipe transistors Ptr and first and second vertical plugs VP1 and VP2 is provided, according to another embodiment of the present disclosure.

The pipe transistors Ptr may be arranged in a matrix form along a plane defined by the x and y directions. For example, a major axis of each of the pipe transistors Ptr may extend in the x direction, and extend in parallel to word lines. The first vertical plugs VP1 may be formed in drain regions DR of the pipe transistors Ptr. The second vertical plugs VP2 may be formed in source regions SR of the pipe transistors Ptr. Strings adjacent to each other in the y direction may be configured identically to each other. Strings adjacent to each other in the x direction may be configured symmetrically to each other. For example, the pipe transistors Ptr and the first and second vertical plugs VP1 and VP2 may be arranged so that the source regions SR of the pipe transistors Ptr may be adjacent to each other. In the layout shown in FIG. 7, the second vertical plugs VP2 may be formed to have a first width W1, and the first vertical plugs VP1 may be formed to have a second with W2 wider than the first width W1. The second width W2 may be set narrower than a length Ly of a minor axis of the pipe transistor Ptr.

Figure 8:
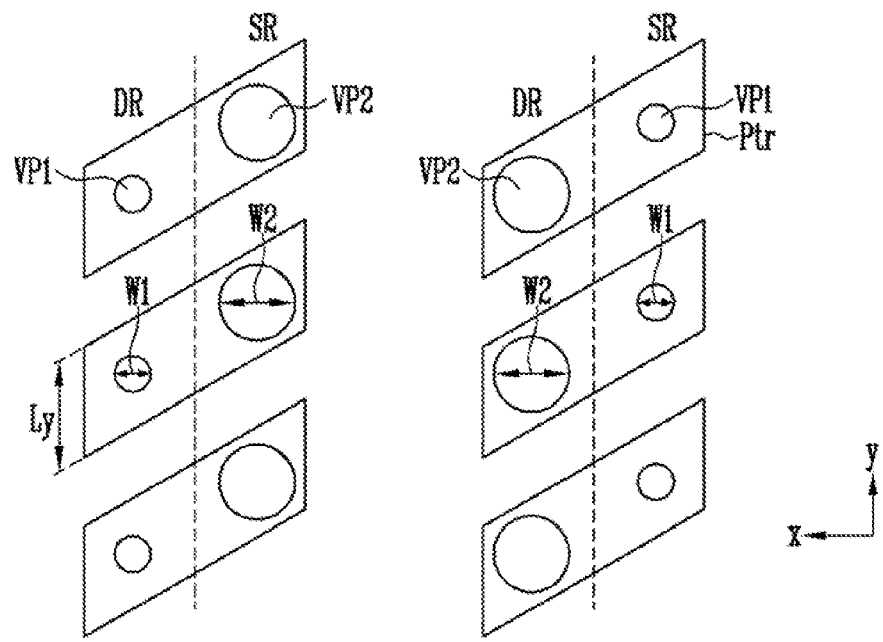

Referring to FIG. 8, a layout of pipe transistors Ptr and first and second vertical plugs VP1 and VP2 is provided, according to yet another embodiment of the present disclosure.

The pipe transistors Ptr may be arranged in a matrix form along a plane defined by the in x and y directions and formed to be inclined at the same angle from the x axis. For example, a major axis of each of the pipe transistors Ptr may extend in a direction intersecting word lines extending in the x direction. The first vertical plugs VP1 may be formed in drain regions DR of the pipe transistors Ptr. The second vertical plugs VP2 may be formed in source regions SR of the pipe transistors Ptr. Strings adjacent to each other in each of the x and y directions may be configured identically to each other. For example, the pipe transistors Ptr and the first and second vertical plugs VP1 and VP2 may be arranged so that the source regions SR of the pipe transistors Ptr may be adjacent to each other. In the layout shown in FIG. 8, the first vertical plugs VP1 may be formed to have a first width W1, and the second vertical plugs VP2 may be formed to have a second with W2 wider than the first width W1. The second width W2 may be set narrower than a length Ly of a minor axis of the pipe transistor Ptr.

Figure 9:
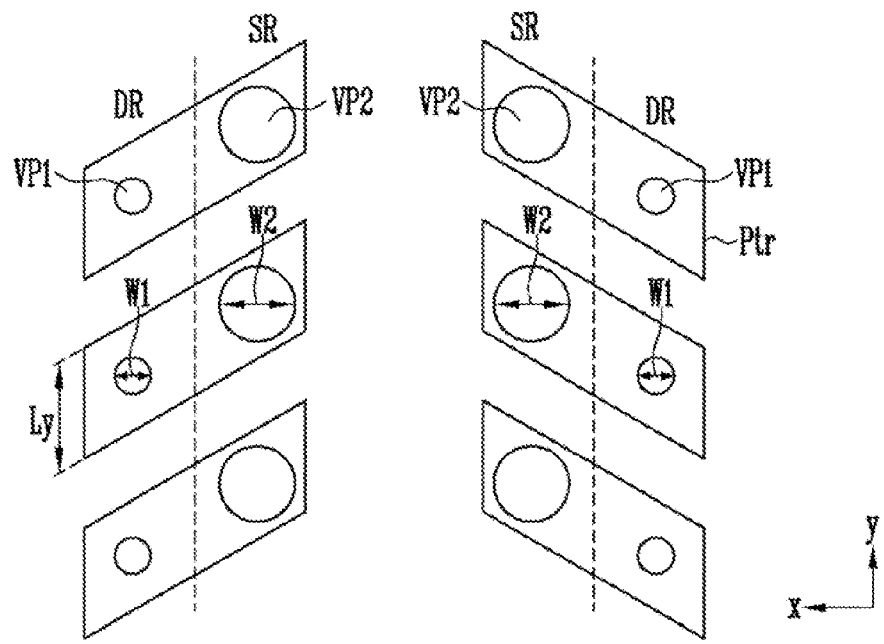

Referring to FIG. 9, a layout of pipe transistors Ptr and first and second vertical plugs VP1 and VP2 is provided, according to yet another embodiment of the present disclosure.

The pipe transistors Ptr may be arranged in a matrix form along a plane defined by the in x and y directions, and formed symmetric to each other with respect to the y axis. For example, a major axis of each of the pipe transistors Ptr may extend in a direction intersecting word lines extending in the x direction. The first vertical plugs VP1 may be formed in drain regions DR of the pipe transistors Ptr. The second vertical plugs VP2 may be formed in source regions SR of the pipe transistors Ptr. Strings adjacent to each other in the y direction may be configured identically to each other. Strings adjacent to each other in the x direction may be configured symmetrically. For example, the pipe transistors Ptr and the first and second vertical plugs VP1 and VP2 may be arranged so that the source regions SR of the pipe transistors Ptr may be adjacent to each other. In the layout shown in FIG. 9, the first vertical plugs VP1 may be formed to have a first width W1, and the second vertical plugs VP2 may be formed to have a second with W2 wider than the first width W1. The second width W2 may be set narrower than a length Ly of a minor axis of the pipe transistor Ptr.

It is noted, however, that the present invention may not be limited to the layouts described in FIGS. 6 to 9, and the pipe transistors Ptr and the first and second vertical plugs VP1 and VP2 may be arranged in other various manners.

FIGS. 10A to 10M are sectional views illustrating a manufacturing method of a 3-D semiconductor device according to an embodiment of the present disclosure. Hereinafter, in the embodiment, a structure in which a width of a second vertical plug is formed wider than a width of a first vertical plug will be described.

Figure 10A:
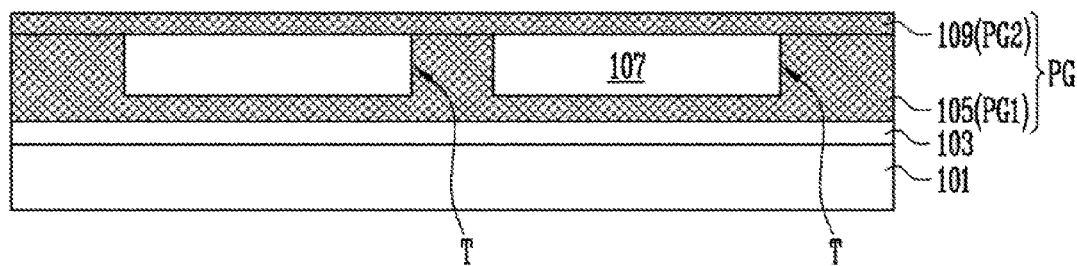
FIGS. 10A to 10M are cross sectional views of a 3-D semiconductor device illustrating various stages of a manufacturing method, according to an embodiment of the present disclosure.

Referring to FIG. 10A, a first interlayer insulating layer 103 may be formed on a substrate 101 in which a pipe region may be defined. After that, a pipe gate PG having a first sacrificial layer 107 embedded therein may be formed on the first interlayer insulating layer 103. The first interlayer insulating layer 103 may be formed to insulate the pipe gate PG from the substrate 101. The first interlayer insulating layer 103 may be formed of a silicon oxide ($SiO_2$) material. The pipe gate PG may include a first conductive layer 105 for a first pipe gate PG1 and a second conductive layer 109 for a second pipe gate PG2. More specifically, the first conductive layer 105 may be formed on a top surface of the first interlayer insulating layer 103. After the first conductive layer 105 is formed, a portion of the first conductive layer 105 formed in the pipe region may be etched so that a plurality of trenches T may be formed inside the first conductive layer 105. After that, the first sacrificial layer 107 may be filled in the trenches T. The first sacrificial layer 107 may be formed of a silicon oxide ($SiO_2$) material. Subsequently, the second conductive layer 109 may be formed on a top surface of the entire structure having the first sacrificial layer 107 formed therein. The first and second conductive layers 105 and 109 may be formed of a polysilicon material.

Figure 10B:
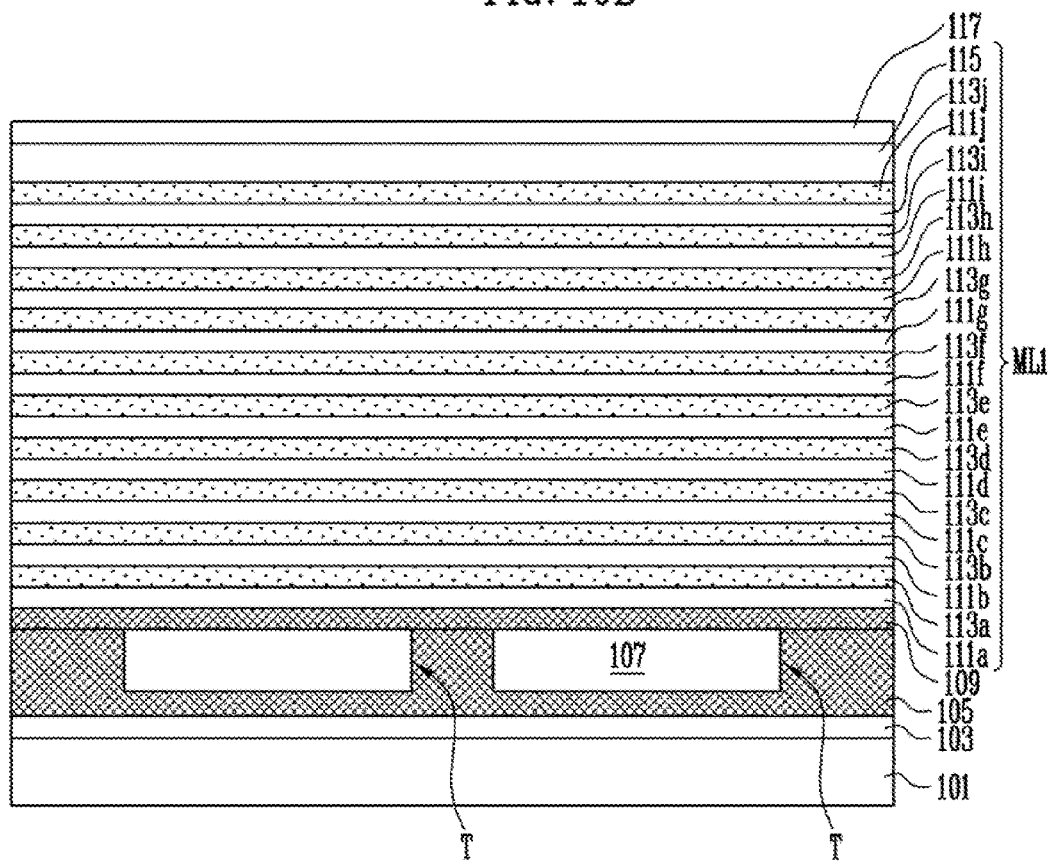

Referring to FIG. 10B, a plurality of second interlayer insulating layers 111a to 111j and a plurality of second sacrificial layers 113a to 113j may be alternately stacked on the top surface of the entire structure having the second conductive layer 109 formed therein, thereby forming a first stacked structure ML1. The second sacrificial layers 113a to 113g may be formed in a region in which word lines are to be formed, and some of the second sacrificial layers 113a to 113g may be formed in a region in which dummy word lines are to be formed. The second sacrificial layers 113h to 113j may be formed in a region in which drain select lines or source select lines are to be formed. The second interlayer insulating layer 111a may be formed prior to the second sacrificial layer 113a. A third interlayer insulating layer 115 may be formed on the uppermost layer of the first stacked structure ML1. The plurality of second interlayer insulating layers 111a to 111j and the third interlayer insulating layer 115 may be formed of a silicon oxide material. The plurality of second sacrificial layers 113a to 113j may be formed of a polysilicon material. The number of the stacked second sacrificial layers 113a to 113j may be adjusted based on the number of memory cells to be stacked.

Subsequently, a hard mask layer 117 may be formed on a top surface of the first stacked structure ML1. The hard mask layer 117 may be preferably formed of a material having an etching selectivity with respect to the plurality of second interlayer insulating layers 111a to 111j, the plurality of second sacrificial layers 113a to 113j, and the third interlayer insulating layer 115. For example, the hard mask layer 117 may be formed of a silicon nitride (SiN) material.

Figure 10C:
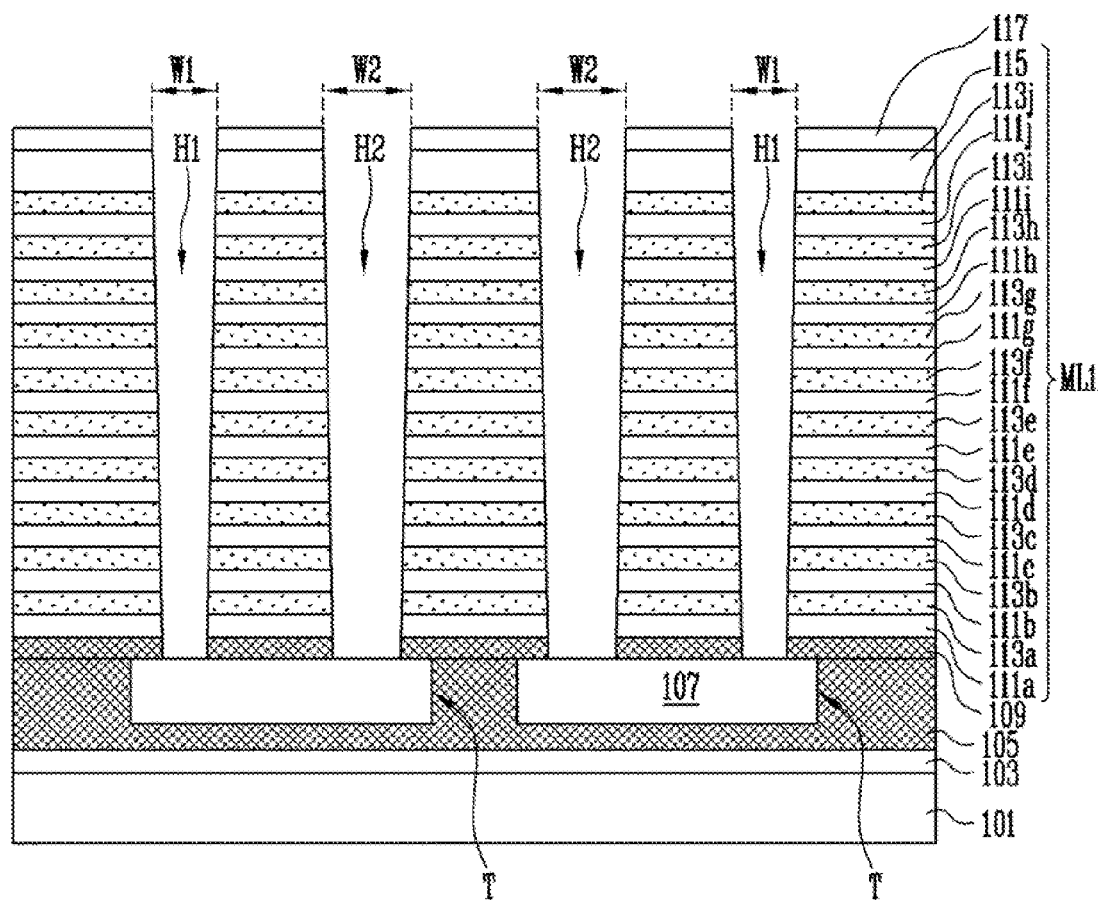

Referring to FIG. 10C, openings for exposing portions of the first stacked structure ML1, at which first and second vertical holes H1 and H2 are to be formed, may be formed in the hard mask layer 117. The widths of the first and second vertical holes H1 and H2 to be formed later may be determined depending on the openings of the hard mask layer 117. In this case, the openings in a region in which the second vertical holes H2 are to be formed may be formed wider than the openings in an area in which the first vertical holes H1 are to be formed. However, the widths of the first and second vertical holes H1 and H2 may vary. Subsequently, an etching process may be performed to remove the first stacked structure ML1 and the second conductive layer 109, which are exposed through the openings of the hard mask layer 117. The first and second vertical holes H1 and H2 passing vertically through the first stacked structure ML1 and the second conductive layer 109 may be formed by the etch process. For example, the first vertical holes H1 may have a first width W1, and the second vertical holes H2 may have a second width W2 wider than the first width W1.

Figure 10D:
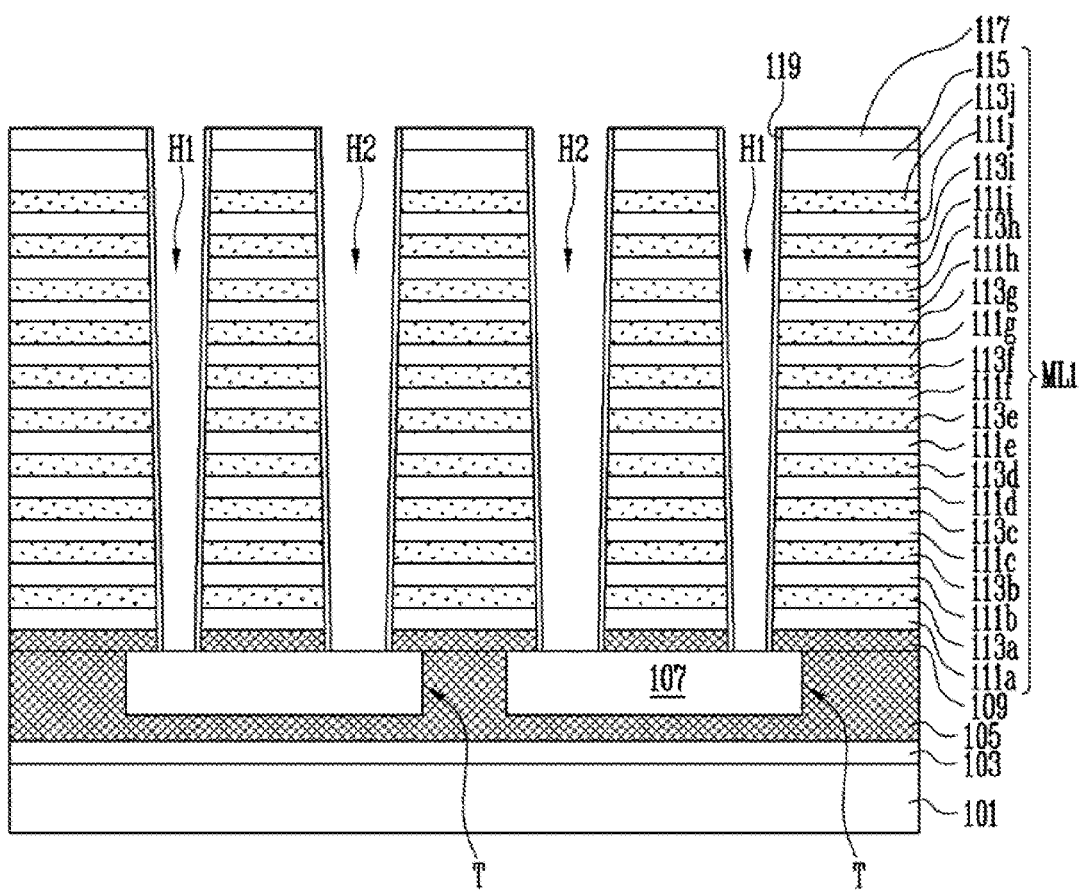

Referring to FIG. 10D, a protective layer 119 may be formed along the sidewalls of the first and second vertical hole H1 and H2. The protective layer 119 may be preferably formed of a material having an etching selectivity with respect to the first sacrificial layer 107, the second interlayer insulating layers 111a to 111j, and the third interlayer insulating layer 115. Like the hard mask layer 117, the protective layer 119 may be formed of a nitride material. In this case, the protective layer 119 may be formed thinner than the hard mask layer 117 so as to prevent the hard mask layer 117 from being completely removed in a subsequent process of removing the protective layer 119.

Figure 10E:
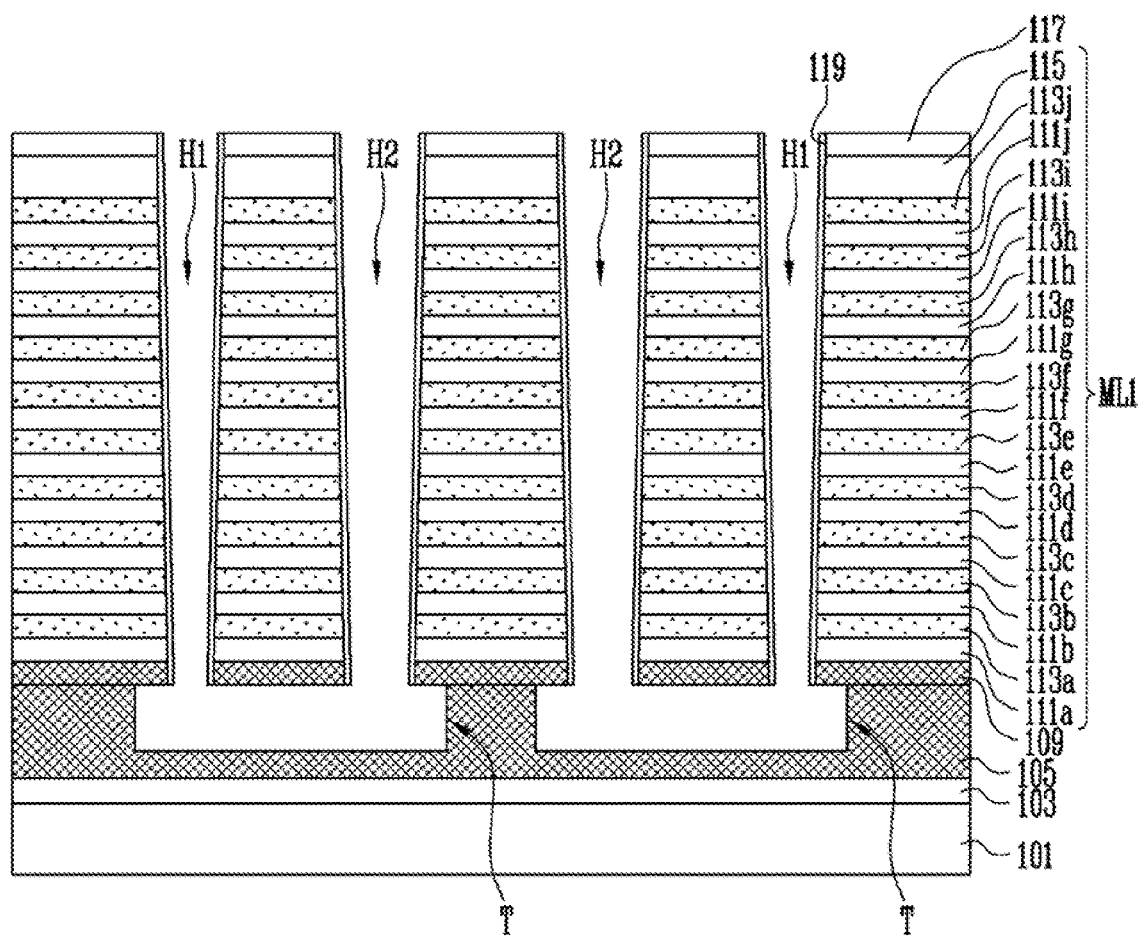

Referring to FIG. 10E, the trenches may be opened by removing the first sacrificial layer 107 using an etching material capable of selectively etching the first sacrificial layer 107. In this case, although the second and third interlayer insulating layers 111a to 111j and 115 may be formed of the same material as the first sacrificial layer 107, the second and third interlayer insulating layers 111a to 111j and 115 may be protected by the protective layer 119. Meanwhile, the hard mask layer 117 formed of the material having an etching selectivity with respect to the first sacrificial layer 107 may remain unremoved in the process of removing the first sacrificial layer 107. When the first sacrificial layer 107 may be formed of a material having an etching selectivity with respect to the second and third interlayer insulating layers 111a to 111j and 115, the process of forming the protective layer 119 may be omitted.

Figure 10F:
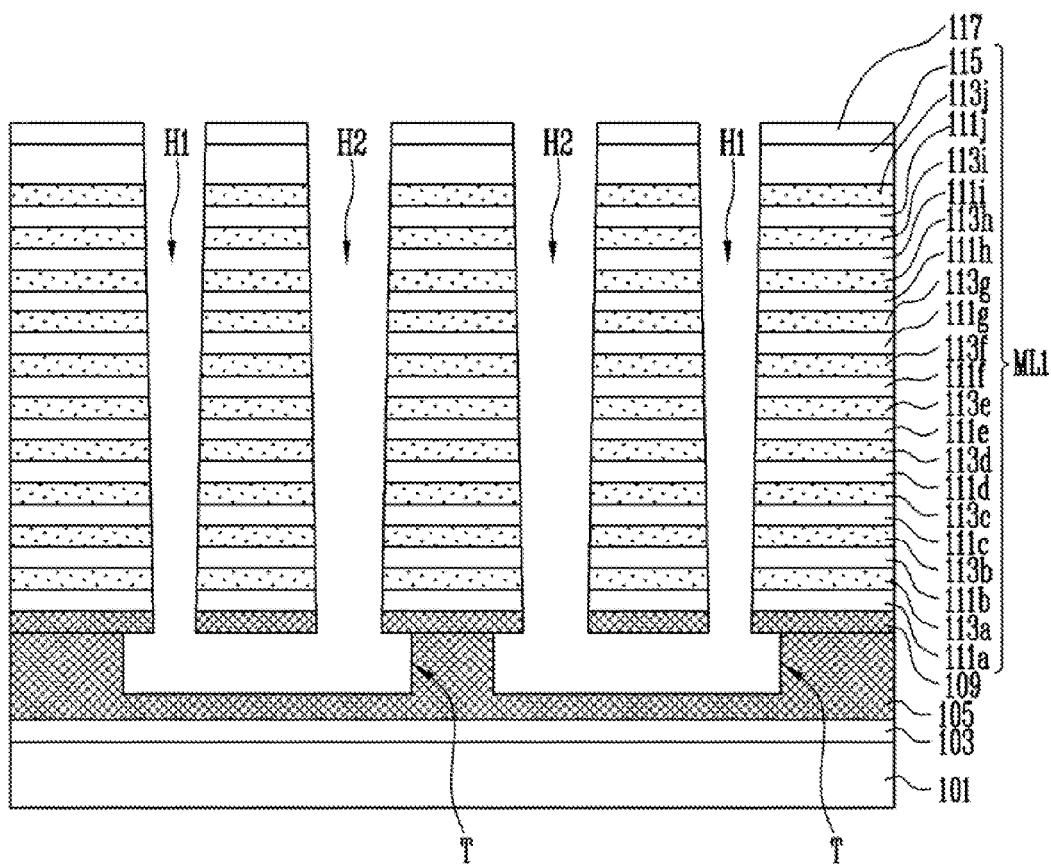

Referring to FIG. 10F, the sidewalls of the first and second vertical holes H1 and H2 may be exposed by removing the protective layer 119 using an etching material capable of selectively etching the protective layer 119. In this case, a portion of the hard mask layer 117 formed of the same material as the protective layer 119 may be removed. However, the hard mask layer 117 may be formed thicker than the protective layer 119. Therefore, the hard mask layer 117 may not be completely removed.

Figure 10G:
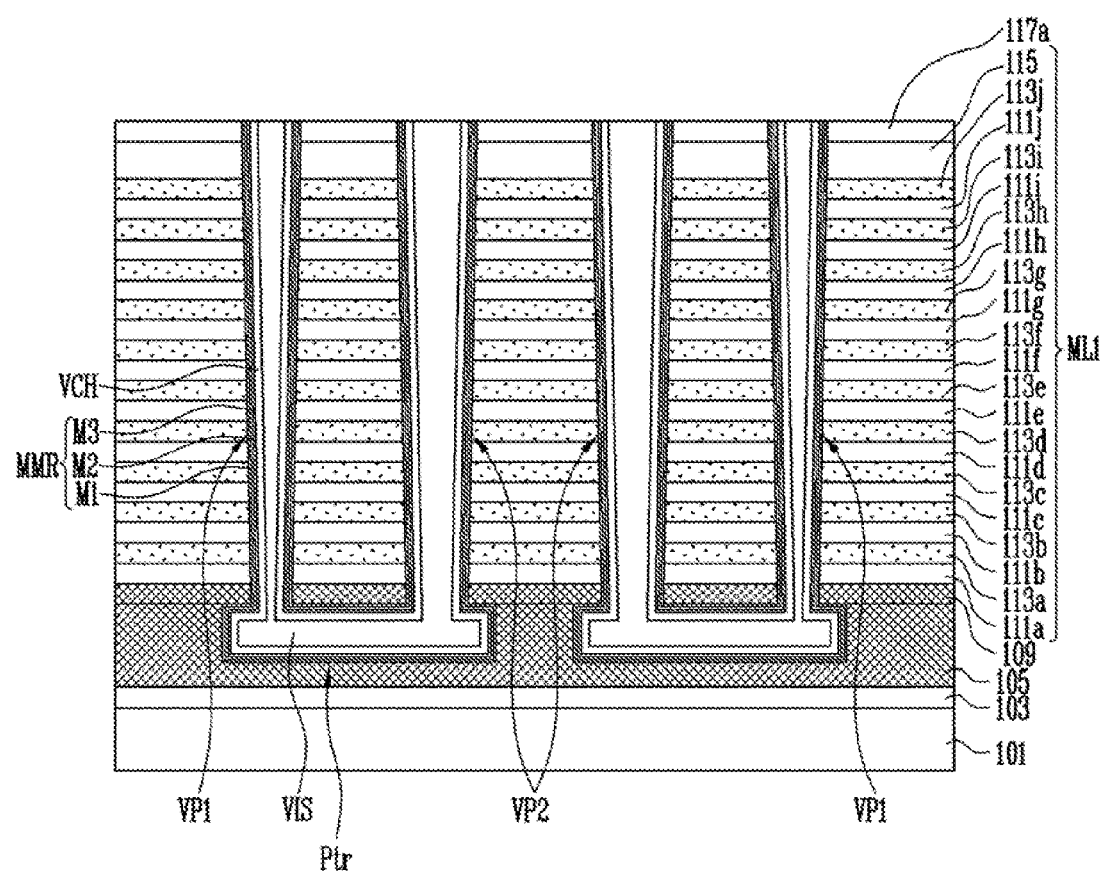

Referring to FIG. 10G, memory layers MMR may be formed along the surface of the entire structure including inner surfaces of the trenches T and the first and second vertical holes H1 and H2. Each of the memory layers MMR may include a blocking layer M1, a charge trapping layer M2 and a tunnel insulating layer M3. The charge trapping layer M2 may be a silicon nitride layer (SiN), a hafnium oxide layer ($HfO_2$), or a zirconium oxide layer ($ZrO_2$), in which charges may be trapped. The blocking layer M1 and the tunnel insulating layer M3 may be formed of a silicon oxide material.

Subsequently, 'U'-shaped vertical channel layers VCH may be formed along the surface of the entire structure including the memory layers MMR. The vertical channel layers VCH may be semiconductor layers formed of a silicon material. The vertical channel layers VCH may be formed along surfaces of the memory layers MMR or formed along inner surfaces of the trenches T and the first and second vertical holes H1 and H2, on which the memory layers MMR may be coated. Among the vertical channel layers VCH, vertical channel layers formed along the inner surfaces of the first vertical holes H1 may be referred to as first vertical channel layers, and vertical channel layers formed along the inner surfaces of the second vertical holes H2 may be referred to as second vertical channel layers. Also, the vertical channel layers formed along the inner surfaces of the trenches T may be formed as pipe channel layers. If the 'U'-shaped vertical channel layers VCH are formed along the surfaces of the memory layers MMR, vertical insulating layers VIS may be filled in the trenches T and the first and second vertical holes H1 and H2, on which the 'U'-shaped vertical channel layers VCH may be coated. The vertical insulation layers VIS may be preferably formed of an insulating material having a high mobility to be filled, without any void, in the first and second vertical holes H1 and H2 and in the trenches T formed in the first conductive layer 105. For example, the vertical insulating layers VIS may be formed of an oxide or poly silazane (PSZ) material. Subsequently, top surfaces of the vertical insulating layers VIS may be planarized by performing a planarizing process. The planarizing process may be stopped when the vertical channel layers VCH are exposed. The planarizing process may be performed using a chemical mechanical polishing scheme. Accordingly, first and second vertical plugs VP1 and VP2 including the memory layers MMR and the vertical insulating layers VIS may be formed.

Figure 10H:
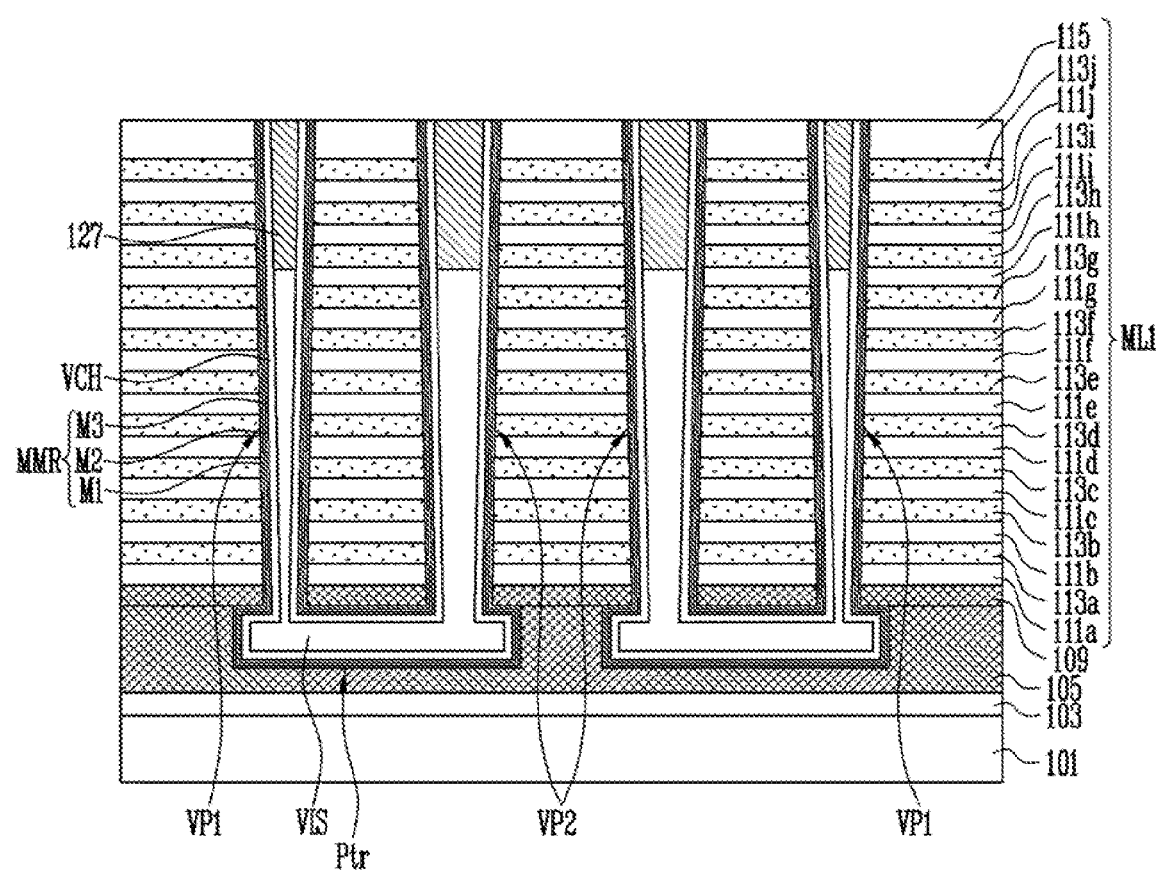

Referring to FIG. 10H, a process of allowing a height of the vertical insulating layers VIS to be lower than a height of the first stacked structure ML1 may be further performed by removing the hard mask layer 117 and partially etching the vertical Insulating layers VIS exposed through the first and second vertical holes H1 and H2. After that, conductive layers 127 may be filled in regions that the vertical Insulating layers VIS may be removed. The conductive layers 127 may be formed of a doped polysilicon material.

The conductive layers 127 may be contacted with upper sidewalls of the vertical channel layers VCH. The conductive layers 127 may be formed to improve a channel resistance of a string. Conditions including the kind, concentration, and the like of a dopant may vary.

Figure 10I:
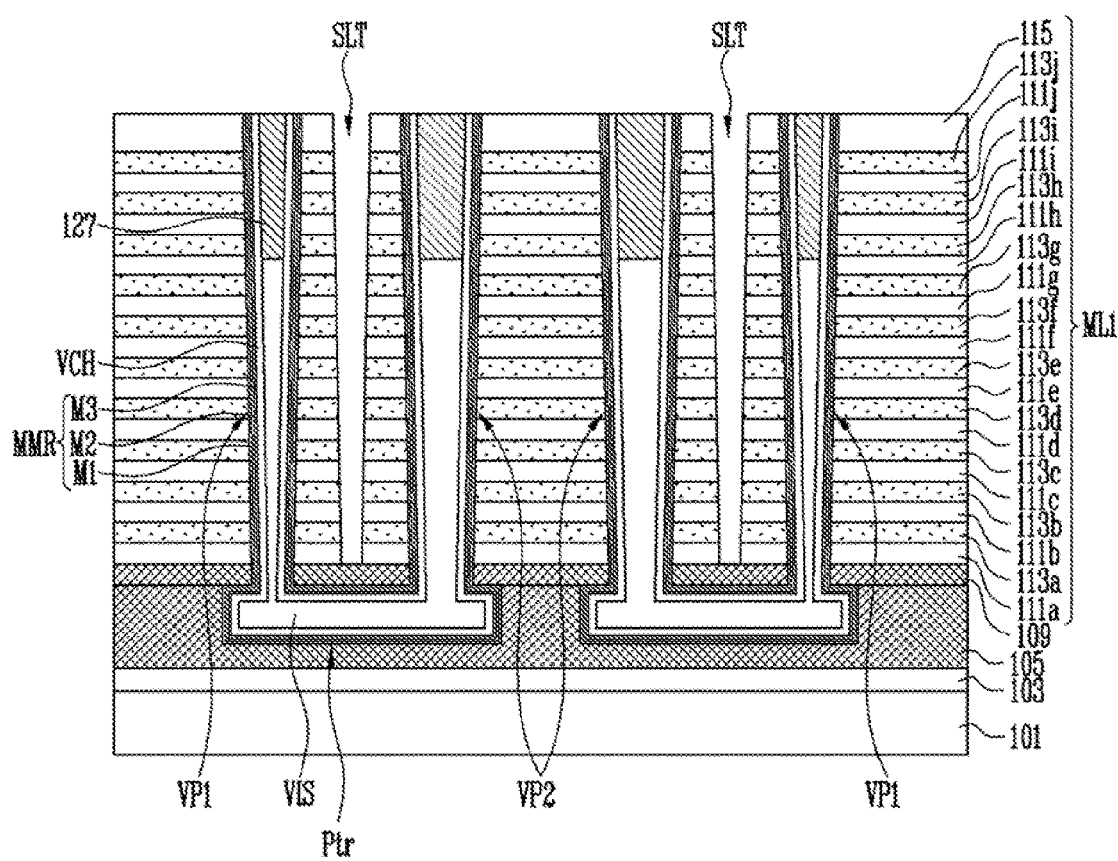
Figure 10J:
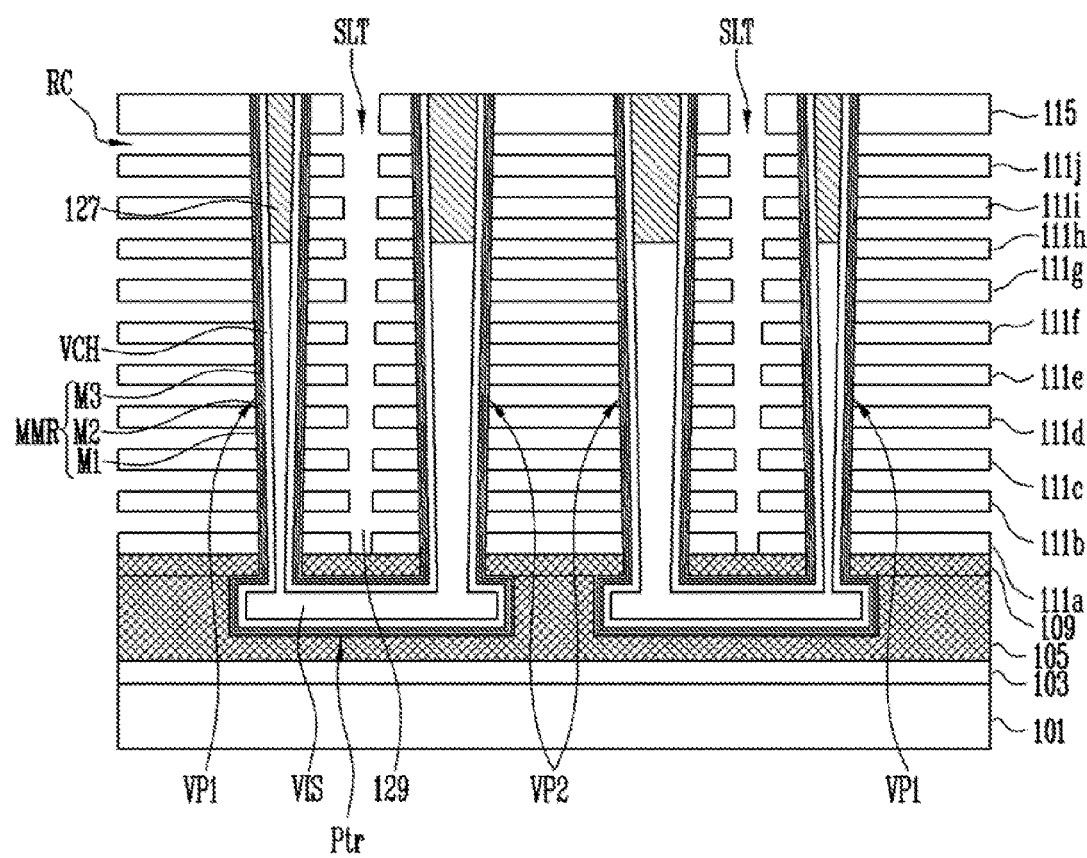

Referring to FIG. 10I, slits SLT passing vertically through the first stacked structure ML1 may be formed by partially etching portions of the first stacked structure ML1 between the first and second vertical plugs VP1 and VP2. The slits SLT may be formed so that the second conductive layer 109 may be exposed.

Referring to FIG. 103, the second sacrificial layers 113a to 113j may be removed. Since the second sacrificial layers 113a to 113j may be exposed through the insides of the slits SLT, the second sacrificial layers 113a to 113j may be removed by performing a wet etching process using an etchant having a fast etching speed for the second sacrificial layers 113a to 113j as compared with the second interlayer insulating layers 111a to 111j. If the second sacrificial layers 113a to 113j are removed, recesses RC may be formed between the second interlayer insulating layers 111a to 111j.

Figure 10K:
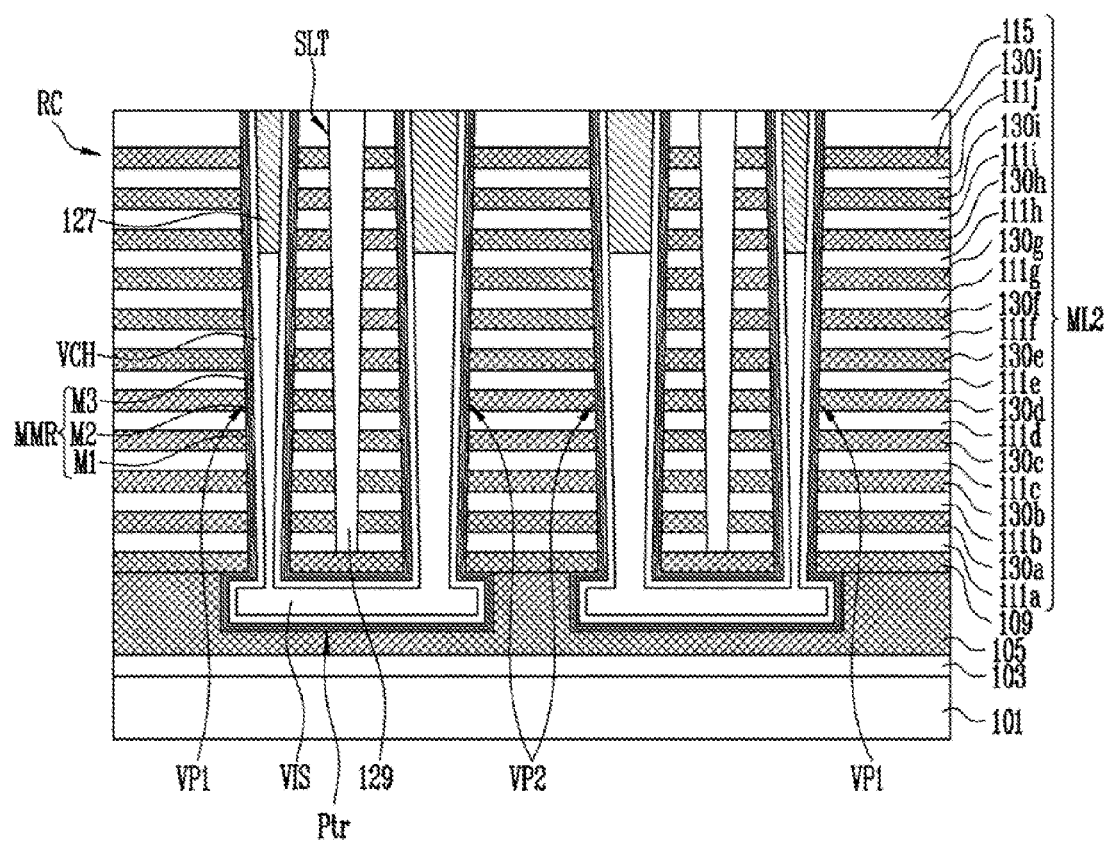

Referring to FIG. 10K, third conductive layers 130a to 130J may be filled in the recesses RC, thereby forming a second stacked structure ML2 having a plurality of alternating layers of second interlayer insulating layers 111a to 111j and third conductive layers 130a to 130j. Subsequently, third conductive layers formed inside the slits SLT among the third conductive layers 130a to 130j may be removed, and a gap-filling insulating layer 129 may be filled in the slits SLT. The gap-filling insulating layer 129 may be preferably formed of an insulating material having a high mobility to be filled, without any void, in the slits SLT having a high aspect ratio. For example, the gap-filling insulating layer 129 may be formed of a polysilazane material.

Figure 10L:
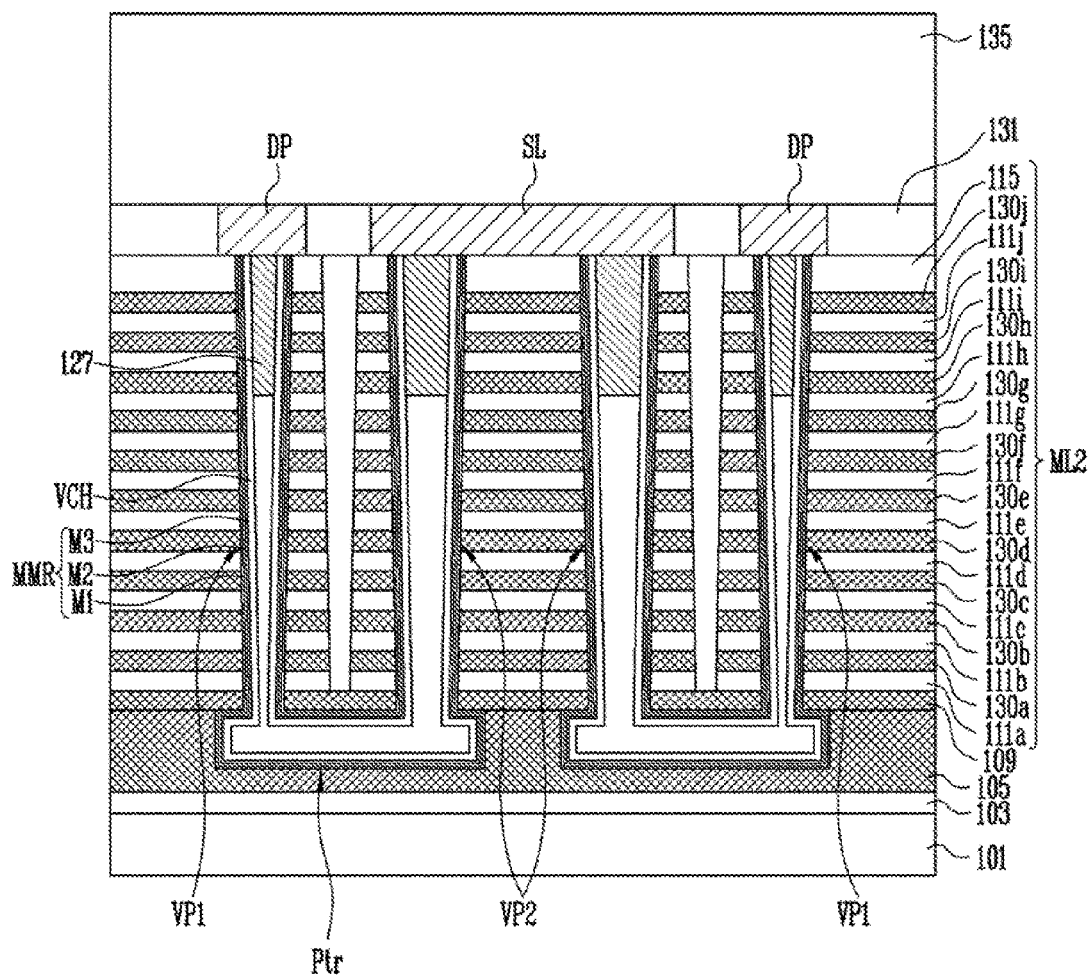

Referring to FIG. 10L, a fourth interlayer insulating layer 131 may be formed on the entire structure. The fourth interlayer insulating layer 131 may be formed of a silicon oxide material. The top surfaces of the first and second vertical plugs VP1 and VP2 may be exposed by removing portions of the fourth interlayer insulating layer 131. Drain pads DP and a source line SL may be formed by filling a conductive material in the exposed regions. The conductive material for the drain pads DP and the source line SL may be formed of a polysilicon material, a metal material, or a stack thereof.

Figure 10M:
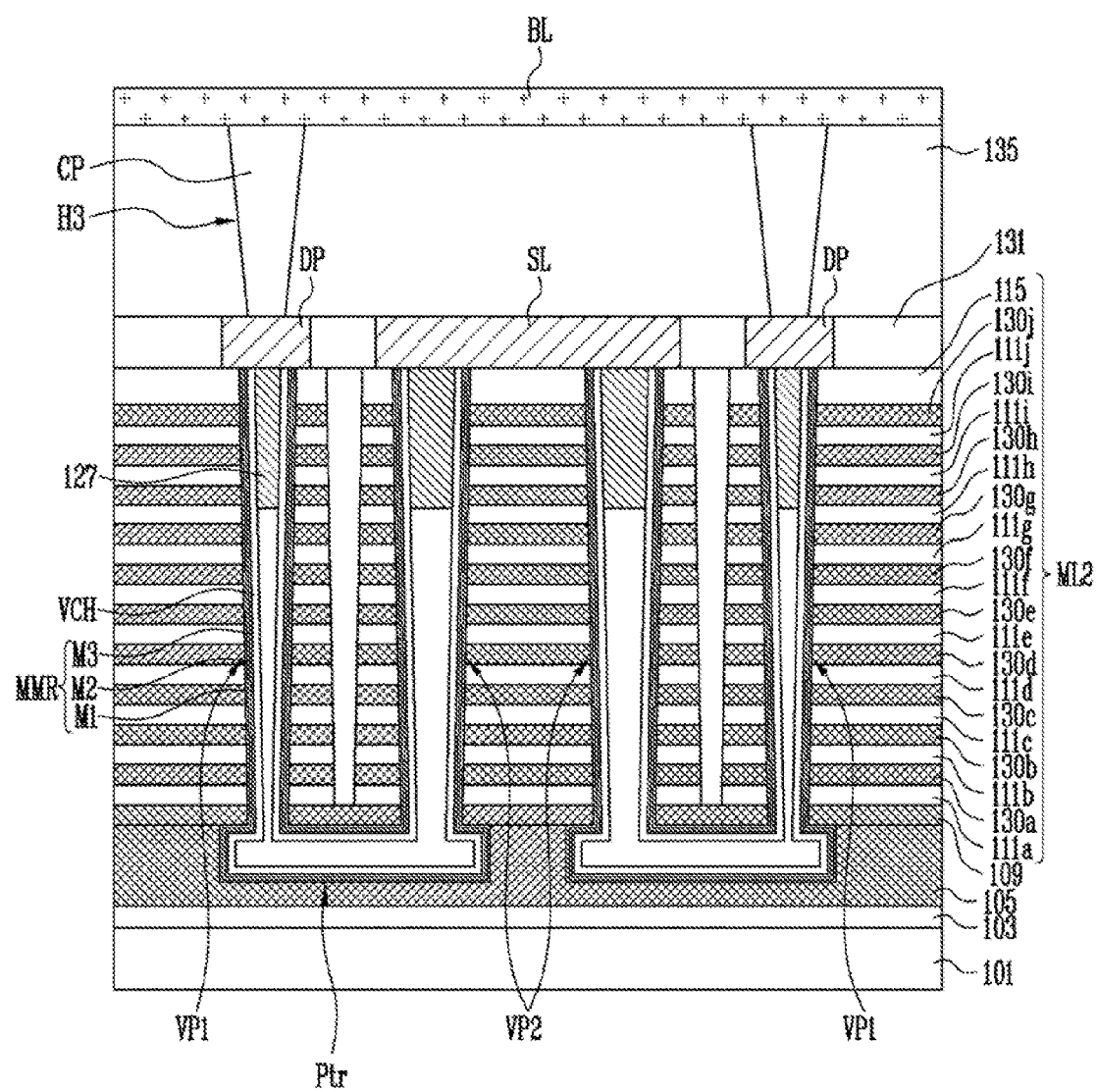

Referring to FIG. 10M, a fifth interlayer insulating layer 135 may be formed on the entire structure in which the pads DP and the source line SL may be formed. The fifth interlayer insulating layer 135 may be formed of a silicon oxide material. Contact holes H3 exposing the respective pads DP may be formed by etching portions of the fifth interlayer insulating layer 135. A width of the contact holes H3 may be formed narrower than a width of the pads DPPD. Contact plugs CP may be formed by filling a conductive material in the contact holes H3. The conductive material for the contact plugs CP may be formed of a polysilicon material or a metal material. Subsequently, a conductive pattern may be formed on the entire structure having the contact plugs CP formed therein, thereby forming a bit line BL.

Figure 11:
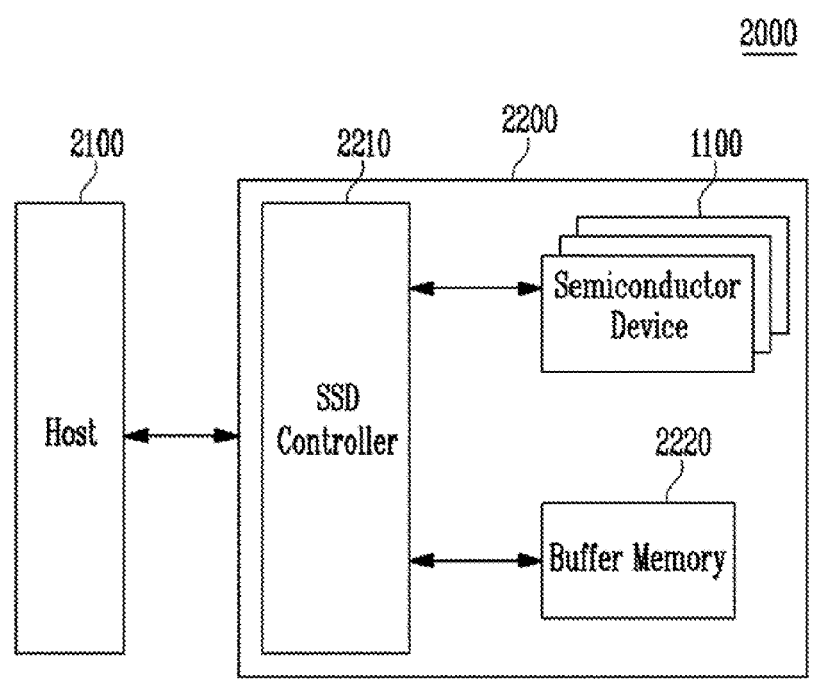
FIG. 11 is a block diagram illustrating a solid state drive including a semiconductor device, according to an embodiment of the present disclosure.

FIG. 11 is a block diagram illustrating a solid state drive (SSD) including a semiconductor device, according to an embodiment of the present disclosure.

Referring to FIG. 11, an SSD device 2000 may include a host 2100 and an SSD 2200. The SSD 2200 may include an SSD controller 2210, a buffer memory 2220, and a semiconductor device 1100.

The SSD controller 2210 may provide a physical interconnection between the host 2100 and the SSD 2200. For example, the SSD controller 2210 may provide an interface between the SSD 2200 and the host 2100, corresponding to a bus format of the host 2100. Particularly, the SSD controller 2210 may decode a command provided from the host 2100. The SSD controller 2210 may access the semiconductor device 1100 based on the decoded command. The bus format of the host 2100 may, for example, include a universal serial bus (USB), a small computer system interface (SCSI), a PCI express, an ATA, a parallel ATA (PATA), a serial ATA (SATA), a serial attached SCSI (SAS), and the like.

The buffer memory 2220 may temporarily store program data provided from the host 2100 or data read out from the semiconductor device 1100. When data existing in the semiconductor device 1100 may be cached at a read request of the host 2100, the buffer memory 2220 may support a cache function to provide the cached data directly to the host 2100. Generally, a data transmission speed of a bus format (e.g., SATA or SAS) of the host 2100 may be higher than that of a memory channel of the SSD 2200. For example, when an interface speed of the host 2100 may be faster than the transmission speed of the memory channel of the SSD 2200, the buffer memory 2200 with a large storage capacity may be provided, thereby minimizing a performance degradation due to the speed difference. The buffer memory 2220 may be provided as a synchronous DRAM to provide a sufficient buffering to the SSD 2200 used as a large-capacity auxiliary storage device.

The semiconductor device 1100 may be provided as a storage medium of the SSD 2200. For example, the semiconductor device 1100, as illustrated in FIG. 1, may be provided as a nonvolatile memory device having a large storage capacity. In an embodiment, the semiconductor device may be provided as a NAND flash memory. Other nonvolatile memory devices may be used.

Figure 12:
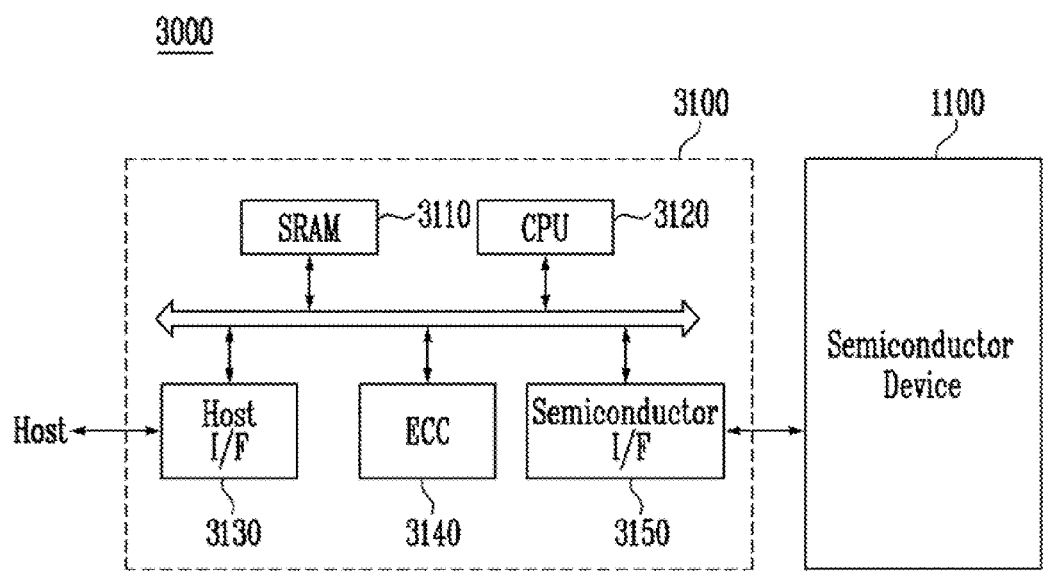
FIG. 12 is a block diagram illustrating a memory system including a semiconductor device, according to an embodiment of the present disclosure.

Referring to FIG. 12, a memory system 3000 according to the embodiment of the present disclosure may include a memory controller 3100 and a semiconductor device 1100.

The semiconductor device 1100 may be configured substantially identical to the semiconductor device of FIG. 2, and therefore, detailed description of the semiconductor device 1100 will be omitted.

The memory controller 3100 may be configured to control the semiconductor device 1100. An SRAM 3110 may be used as a working memory of a CPU 3120. A host interface (Host I/F) 3130 may be provided with a data exchange protocol of a host coupled to the memory system 3000. An error correction circuit (ECC) 3140 provided in the memory controller 3100 may detect and correct errors included in data read out from the semiconductor device 1100. A semiconductor interface (Semiconductor I/F) 3150 may interface with the semiconductor device 1100. The CPU 3120 may perform a control operation for data exchange of the memory controller 3100. Although not shown in FIG. 12, the memory system 300 may further include a ROM (not shown) for storing code data for interfacing with the host.

The memory system 3000 may be applied to a computer, an ultra-mobile PC (UMPC), a workstation, a net-book, a personal digital assistant (PDA), a portable computer, a web tablet, a wireless phone, a mobile phone, a smart phone, a digital camera, a digital audio recorder, a digital audio player, a digital video recorder, a digital video player, a device capable of transmitting/receiving information in a wireless environment, and one of various electronic devices that constitute a home network.

Figure 13:
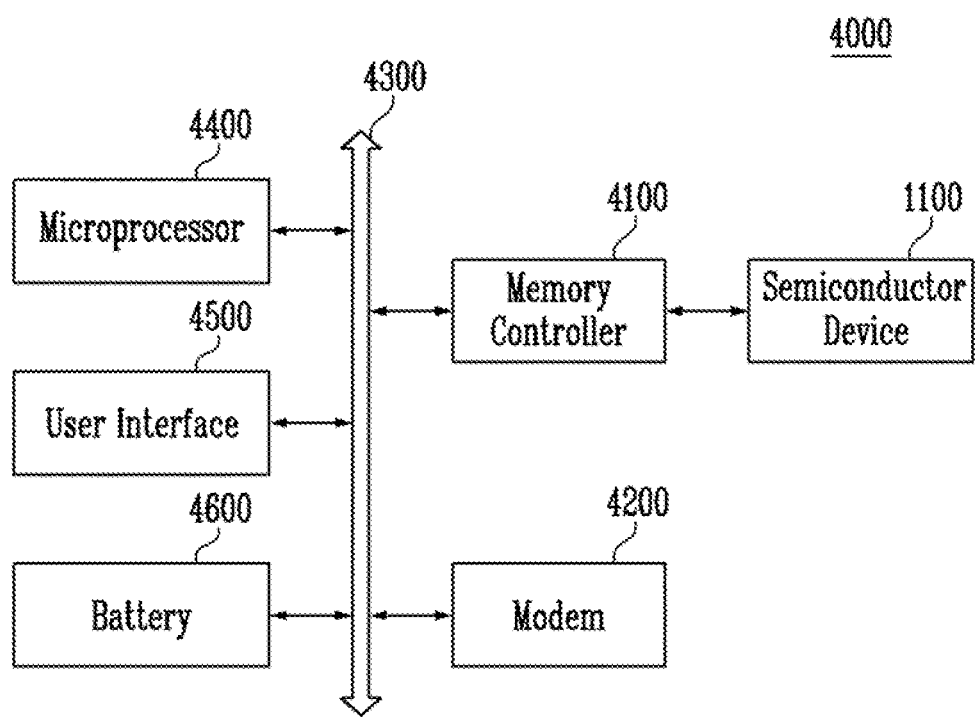
FIG. 13 is a diagram illustrating a schematic configuration of a computing system including a semiconductor device, according to an embodiment of the present disclosure.

Referring to FIG. 13, a computing system 4000 according to an embodiment of the present disclosure may include a semiconductor device 1100. The computing system 4000 may include a memory controller 4100, a modem 4200, a microprocessor 4400, and a user interface 4500, all of which are electrically coupled to a bus 4300. When the computing system 4000 may be a mobile device, a battery 4600 for supplying operation voltages of the computing system 4000 may be additionally provided in the computing system 4000. Although not shown in FIG. 13, the computing system 4000 may further include an application chip set, a camera image processor (CIS), a mobile DRAM, and the like.

The semiconductor device 1100 may be configured substantially identical to the semiconductor device of FIG. 2, and therefore, detailed description of the semiconductor device 1100 will be omitted.

The memory controller 4100 and the semiconductor device 1100 may constitute a solid state drive/disk (SSD).

The semiconductor device and the memory controller may be packaged in various forms. For example, the semiconductor device and the memory controller may be packaged, for example, using package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), a wafer-level processed stack package (WSP) and the like.

According to the present disclosure, a semiconductor device is provided having an improved 3-D structure exhibiting improved electrical characteristics when compared to existing 3-D structures. Moreover, the reliability of the 3-D semiconductor device of the present disclosure may also be improved due to the improved electrical characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and or scope of the present disclosure as set forth in the following claims.

What is claimed is:

1. A 3-D semiconductor device, comprising:
a substrate extending along a first plane defined by first and second x and y directions, the substrate having a pipe transistor formed therein,
a plurality of word lines spaced apart at regular intervals along a third direction z perpendicular to the first and second x and y directions;
a first vertical plug connected to a first end of the pipe transistor by passing vertically through the word lines;
a second vertical plug, connected to a second end of the pipe transistor by passing vertically through the word lines;
a bit line connected to a top surface of the first vertical plug; and
a source line connected to a top surface of the second vertical plug,
wherein the first and second vertical plugs include a vertical channel layer and have different sizes.

2. The 3-D semiconductor device of claim 1, wherein each of the first and second vertical plugs includes a memory layer.

3. The 3-D semiconductor device of claim 2, wherein the vertical channel layer is formed at the center of each of the first and second vertical plugs, and the memory layer is formed to surround the channel layer.

4. The 3-D semiconductor device of claim 3, wherein the memory layer includes:
a tunnel insulating layer surroundings the channel layer;
a charge trapping layer surrounding the tunnel insulating layer; and
a blocking layer surrounding the charge trapping layer.

5. The 3-D semiconductor device of claim 1, wherein the first vertical plug, the pipe transistor, and the second vertical plug constitute a 'U'-shaped string.

6. The 3-D semiconductor device of claim 1, wherein the word lines are spaced apart from each other between the first and second vertical plugs.

7. The 3-D semiconductor device of claim 6, further comprising drain select lines formed between the bit line and the word lines formed along the first vertical plug.

8. The 3-D semiconductor device of claim 6, further comprising drain select lines formed between the bit line and the word lines formed along the first vertical plug.

9. The 3-D semiconductor device of claim 1, wherein, if the first vertical plug has a weaker program disturbance or a slower program or erase operation speed than the second vertical plug, the width of the first vertical plug is formed narrower than the width of the second vertical plug, and wherein, if the second vertical plug has a weaker program disturbance or a program or erase operation speed slower than the first vertical plug, the width of the second vertical plug is formed narrower than the width of the first vertical plug.

10. The 3-D semiconductor device of claim 9, wherein the width of a vertical plug having a wider width among the first and second vertical plugs is narrower than a length of a minor axis of the pipe transistor.

11. The 3-D semiconductor device of claim 10, wherein a major axis of the pipe transistor extends in a direction parallel to the word lines.

12. The 3-D semiconductor device of claim 10, wherein a major axis of the pipe transistor extends in a direction intersecting the word lines.

* * * * *